United States Patent [19]

McAllister et al.

[11] Patent Number: 4,733,170

[45] Date of Patent: Mar. 22, 1988

[54] MICROWAVE POWER SENSORS

[75] Inventors: Paul A. McAllister, Huntingdon; Thomas G. McConnell, Hitchin; Frederick R. Weston, Stevenage, all of England

[73] Assignee: Marconi Instruments Limited, St. Albans, England

[21] Appl. No.: 867,697

[22] Filed: May 28, 1986

[30] Foreign Application Priority Data

May 28, 1985 [GB] United Kingdom ............. 8513373
Mar. 19, 1986 [GB] United Kingdom ............. 8606785

[51] Int. Cl.$^4$ .................. G01R 23/04; G01R 5/26; H01P 1/00
[52] U.S. Cl. ............................ 324/95; 324/106; 333/248
[58] Field of Search ............... 324/106, 95; 340/600; 455/67, 330; 333/248, 128

[56] References Cited

U.S. PATENT DOCUMENTS 4,506,234  3/1985  Vittoria ................... 333/248 X
4,568,893  2/1986  Sharma ................... 333/248 X
4,590,617  5/1986  Kraemer ................. 455/330 X

FOREIGN PATENT DOCUMENTS 0839992  6/1960  United Kingdom .
1028180  5/1966  United Kingdom .
2017319  7/1982  United Kingdom .

OTHER PUBLICATIONS

Roald Schrack, "Radio Frequency Power Measurements", National Bureau of Standards Circular 536, Mar. 16, 1953, p. 4.

*Primary Examiner*—Reinhard J. Eisenzopf
*Assistant Examiner*—Vinh P. Nguyen
*Attorney, Agent, or Firm*—Spencer & Frank

[57] ABSTRACT

A microwave power sensor utilizing a semiconductor power absorption element which is mounted on a finline structure within a waveguide channel. In order to check calibration of the sensor, a coaxial line is used to feed a relatively low frequency reference signal to the power sensor. The power element is positioned between the input port of the waveguide and a coaxial line input port at which the reference signal is applied. The use of a precise and accurate reference signal enables the power sensor to be used for microwave measurements.

13 Claims, 3 Drawing Figures

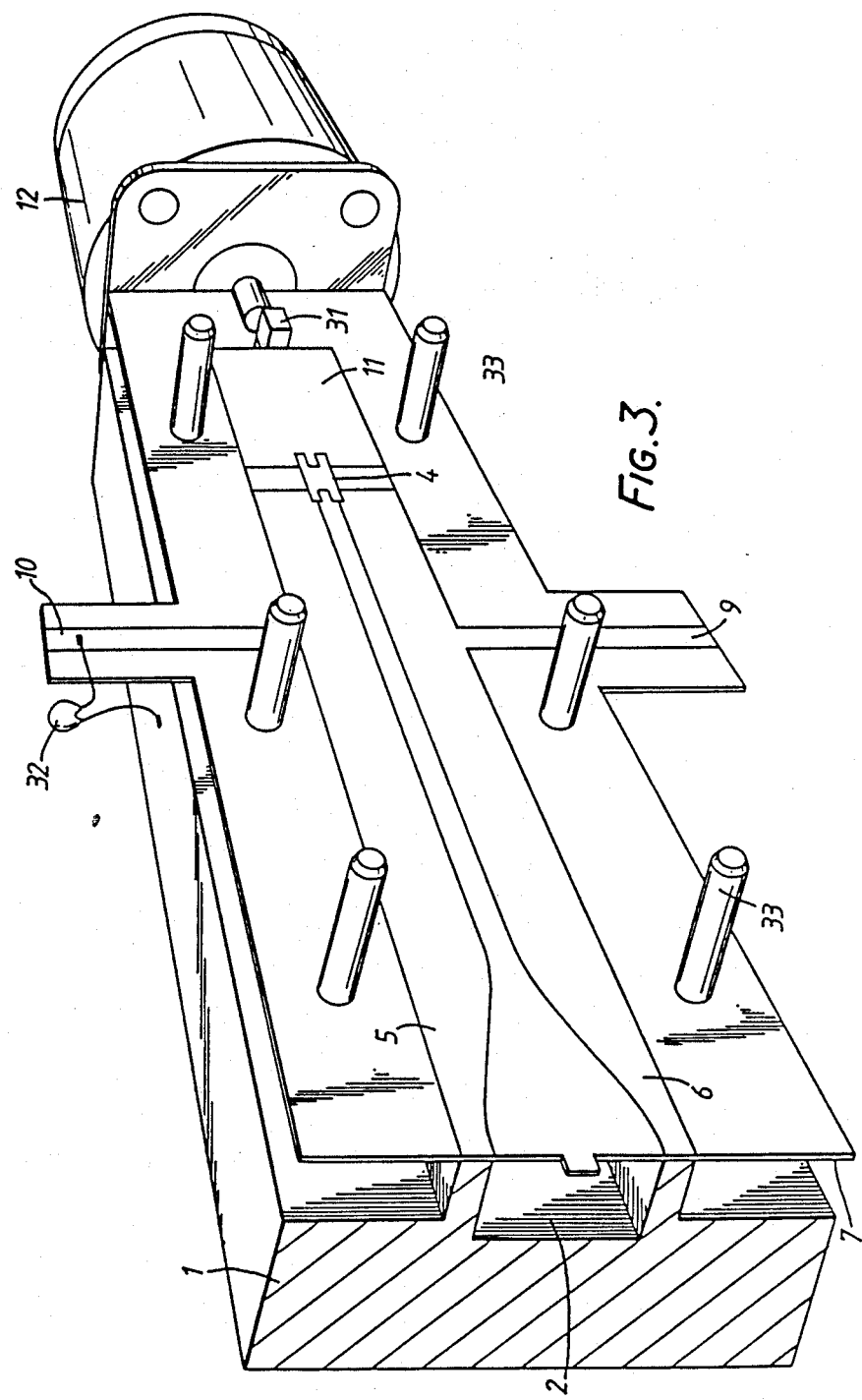

MICROWAVE POWER SENSORS

BACKGROUND OF THE INVENTION

This invention relates to power sensors, and is specifically concerned with sensors which measure the power of an applied microwave signal. Power at microwave frequencies can be determined as a measure of the rise in temperature of a load which absorbs the power and it has been proposed to utilize a power absorption element incorporating a thermocouple as the load in which the magnitude of an output signal is related to the incident microwave power. When implemented as a semiconductor arrangement, the power absorption element is termed a semiconductor thermoelectric element.

The relationship between output signal and applied power is a non-linear one, and it is usually necessary to provide some form of calibration for the power sensor by applying known reference power levels, and noting the resulting output signals, the values of which preferably cover the range of power and frequency values to be encountered. Once the calibration has been completed, it is necessary to subsequently apply a reference power level to the sensor so that either its output signal can be brought to a predetermined value or so that a correction factor can be applied. This procedure is usually necessary before a series of measurements are to be performed to allow for drift in the operating characteristics of the power sensor. As it becomes desirable to extend the operation of power sensors to higher frequencies at which waveguide transmission techniques are required, a limiting factor is the difficulty encountered in providing a suitable reference power level having a sufficiently accurate and stable value. The present invention seeks to provide an improved power sensor.

SUMMARY OF THE INVENTION

According to a first aspect of this invention a power sensor includes a waveguide section; a power element mounted within the waveguide section so as to absorb microwave power applied to it; and means for applying a reference power signal at a sub-microwave frequency to the power element via a transmission line.

According to a second aspect of this invention a power sensor includes a waveguide section; a power element within the waveguide section so as to absorb microwave power applied to it; a fin line structure on which the power element is mounted so as to be coupled to incident microwave power; and means for applying a reference power signal at a sub-microwave frequency to the power element via a transmission line.

Whereas the microwave power to be sensed may be within the microwave frequency band, typically of 10 GHz to 100 GHz (although these figures are by way of example only) the reference signal is at a much lower frequency at which waveguide transmission techniques are not practicable. For example, the frequency of the reference signal may be of the order of only 50 MHz, at which frequency an accurate power level can be readily and consistently obtained from a fairly simple signal source, and it is transmitted to the power element via a transmission line, such as a coaxial cable. Conversely, it is difficult and expensive to generate a reference signal at a microwave frequency which has a specified power level to a required degree of accuracy and consistency. Accordingly, the invention provides a power input which is completely separate from that at which the microwave power is applied, so as to permit the use of a very much lower reference frequency signal.

The power element is mounted directly on to the fin line structure; (or on an extension thereof), and preferably the dimensions of the power sensor are comparable with those of the longitudinal gap in the fin line structure itself. This results in an efficient coupling of power from the fin line structure to the power element provided that the impedances are correctly matched.

It is found that the very wide difference in frequency between the reference signal and the microwave power does not cause significant difficulties in the making of accurate measurements, it being more important to permit the use of a very accurately known and consistent reference signal which is properly coupled to the power element.

BRIEF DESCRIPTION OF THE DRAWINGS

The invention is further described by way of example with reference to the accompanying drawings in which:

FIG. 3 is a perspective view illustrating the construction of a power sensor.

DESCRIPTION OF THE PREFERRED EMBODIMENTS

Figure 1:
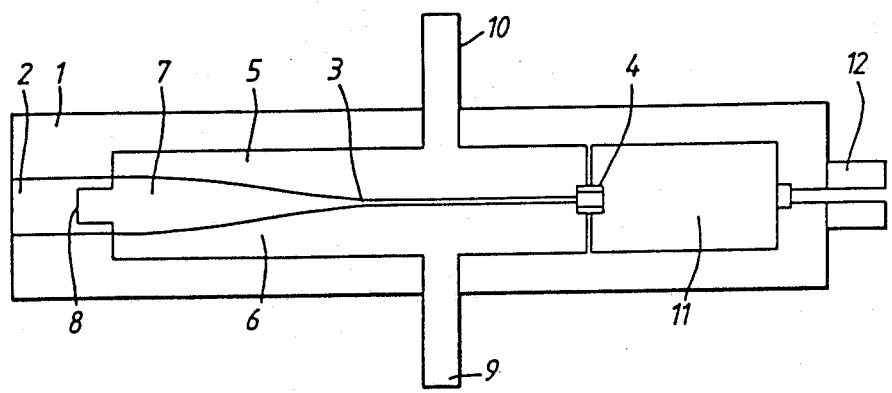
FIG. 1 shows part of a power sensor in a diagramatic manner.

Referring to FIG. 1, just those elements of the power sensor necessary for an understanding of its mode of operation are illustrated therein. A waveguide 1 is provided with a rectangular channel having an input port 2, at which incident microwave energy at frequencies up to 40 GHz is received. The microwave energy is fed via a fin line structure 3 to a small power absorption device or element 4. The fin line structure consists of a pair of shaped conductors 5 and 6 lying on an insulating dielectric substrate 7 which is fitted into the E-plane of the waveguide channel. In this instance, the two conductors 5 and 6 are both mounted on the same surface of thin dielectric substrate 7, which is provided with a quarter wavelength transition 8. The conductors may be placed in contact with both surfaces of the substrate 7. The fin line structure 3 is operative to convert the applied waveguide mode energy to the fin line mode such that the energy is conveniently presented in an efficient manner to the power element 4 which is of the same order of size as the narrow gap between the two conductors 5 and 6. The conductors are provided with curved edges to give a smooth transition from the waveguide mode, the curves in this instance following a $\sin^2$ profile.

The power element 4 consists of two elements mounted on a common semiconductor substrate. The elements each include an associated resistor which converts the incident microwave energy into heat. Each resistor is typically formed of tantalum nitride and is insulated from the semiconductor by an intervening layer of silicon dioxide. The resulting semiconductor thermoelectric elements are thereby provided with hot and cold junctions across which a potential difference is produced. By virtue of the electrical connections provided by the fin line structure 3 and a conductive region 11, the two potential differences are effectively in series and add. The region 11 is constituted by a planar conductor mounted on the dielectric substrate to constitute a transmission line. The conductor 6 of the fin line structure 7 is grounded at point 9, and the generated voltage is taken off at point 10 as the output signal. In order to give impedance matching, each resistor and the silicon in series with it has a total resistance of 100 ohms. Thus they exhibit a load of 200 ohms when in series and 50 ohms when in parallel. The incident microwave power is applied to the elements in series, so that the fin line has a matched 200 ohms impedance. This gives a reasonably wide longitudinal gap along the fin line. The reference power is applied via a transmission line having a characteristic impedance of 50 ohms.

The level of the output voltage present at point 10 is uniquely indicative of the power level applied to the input port 2 for a given frequency, but in order to determine the true level, the power element 4 must be accurately calibrated and this is done during manufacture of the power sensor. To enable the calibration characteristics to be used at a later date when its properties will have aged or drifted, it is necessary to apply a reference signal, and to note the extent to which the output signal differs from its calibration value. In order to do this, an accurately known reference signal at a much lower frequency, typically of the order of 50 MHz is applied via a co-axial line, having a 50 ohm characteristic impedance, to a co-axial line input port 12 whence it is applied to both elements. By ensuring that a very precisely known level of power is applied to the power element 4 via the coaxial port 12, the response in terms of voltage difference to other power levels can be determined by reference to the calibration characteristics. As the power element 4 operates in an RMS mode to measure absolute power by responding to the heat absorbed in the resistors it is found that the effect of even wide frequency differences can be neglected. This technique completely avoids the need to apply a reference signal at a microwave frequency which is of the same order as the signals under test. It is a relatively simple and economical matter to provide a reference signal at a frequency of the order of 50 MHz whose power level is at a precisely known value, and which can be held constant and consistent. The sensor can then be used to perform precise measurements on microwave signals.

Figure 2:
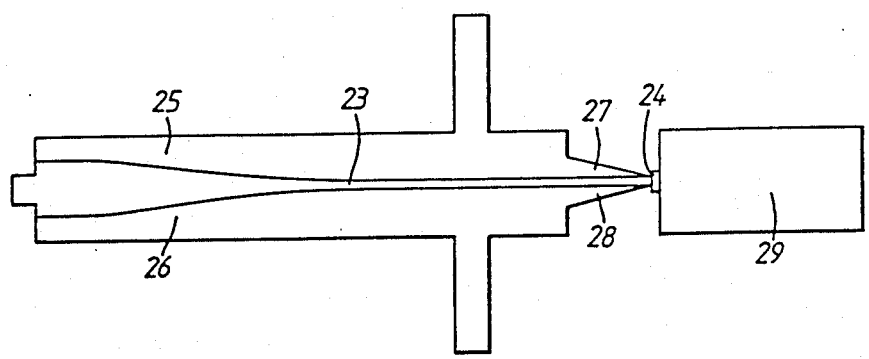
FIG. 2 shows a higher frequency version.

As higher and higher microwave frequencies are to be measured the preferred size of the power element becomes smaller and an alternative structure is shown in FIG. 2 in which just a modified fin line structure is illustrated. In this instance, the fin line structure 23 consists of two conductors 25 and 26 as previously lying on an insulating substrate 23, but they are fed via a rather longer and more gradual taper to a very small power element 24 which is mounted at the tips of impedance matching extensions 27 and 28 of the conductors 25 and 26. Apart from the extensions 27 and 28, the structure is in essence very similar to that shown in FIG. 1, as the low frequency reference signal is applied via a conductor 29.

A typical construction of the invention is illustrated in FIG. 3, in which reference numerals corresponding to those used in FIG. 1 are used. The structure shown in FIG. 3 represents just part of the waveguide 1, and one half of the waveguide channel 2. Overlying the half of the waveguide channel illustrated is the thin electrically insulating dielectric substrate 7 which carries two conductors 5 and 6 which are shaped such that the curved portions in the region adjacent to the microwave input port have a $\sin^2$ taper profile. The two conductors are separated by a narrow gap running longitudinally along the central axis of the waveguide. The conductors 5 and 6, and the substrate 7 constitute a fin line structure having a characteristic impedance of 200 ohms. The power element 4 is mounted so as to electrically bridge the two conductors 5 and 6 and the conductor 11 which is connected to the coaxial connector 12 via a d.c. blocking capacitor 31. The termination 9 is grounded, and the output signal is taken off from termination 10 which is decoupled, so far as the 50 MHz signal is concerned, by means of a small capacitor 32 connecting the termination 10 to the waveguide structure 1. Six dowels 33 project from the waveguide so as to permit very accurate alignment of it with the fin line structure and with the other half of the waveguide which is not shown. The power element itself could be manufactured in accordance with the techniques described in co-pending U.S. patent application Ser. No. 787,908 filed Oct. 16, 1985.

We claim:

1. A microwave power sensor including
 a waveguide section;
 power absorption means having two power elements located within said waveguide section, said power absorption means absorbing microwave power applied thereto;
 a fin line structure located within said waveguide section, said power absorption means being mounted on said structure for coupling to a source of incident microwave power; and
 means for applying a reference power signal at a sub-microwave frequency to the absorption means via a transmission line having a predetermined characteristic impedance, the two power elements of said power absorption means being connected effectively in series to receive said microwave power and effectively in parallel to receive said reference power signal.

2. A sensor as claimed in claim 1 and wherein the transmission line comprises a planar conductor on a dielectric substrate.

3. A sensor as claimed in claim 1 wherein the characteristic impedance of said transmission line is less than that of the portion of the fin line structure which couples microwave power to said power absorption means.

4. A sensor as claimed in claim 1, and wherein the transmission line is positioned on the side of said power absorption means opposite to that of the fin line structure.

5. A sensor as claimed in claim 2, wherein a coaxial cable is connected to said planar conductor to feed said reference power signal to the power absorption means.

6. A sensor as claimed in claim 5 and wherein a d.c. decoupling capacitor is connected between the coaxial cable and said power absorption means.

7. A sensor as claimed in claim 1 and wherein the fin line structure comprises a dielectric substrate which carries a pair of conductors separated by a narrow gap running centrally along the waveguide.

8. A sensor as claimed in claim 1 wherein each of said power elements includes a resistor adapted to absorb heat from incident microwave energy, and means for producing a signal related to the temperatures of said resistors.

9. A sensor as claimed in claim 3 wherein said power absorption means comprises a semiconductor thermoelectric element.

10. A sensor as claimed in claim 4 wherein said power absorption means comprises two thermoelectric elements, the respective thermoelectric e.m.f.'s of which are arranged to add.

11. A sensor as claimed in claim 10 wherein the two thermoelectric elements are connected effectively in series to receive said microwave power and effectively in parallel to receive said reference power signal.

12. A sensor as claimed in claim 11 wherein said power absorption means comprises two thermoelectric elements mounted on a common semiconductor substrate, with the reference power signal being applied to a mid-point of the series connection.

13. A microwave power sensor including
   a waveguide section;
   a power absorption device located within said waveguide section, said power absorption device absorbing microwave power applied thereto;
   a fin line structure on which said power absorption device is mounted for coupling to a source of incident microwave power;
   means for applying a reference power signal at a sub-microwave frequency to said power absorption device, said means including a transmission line comprising a dielectric substrate having a planar conductor mounted thereon and a coaxial cable connected to said planar conductor for receiving said reference power signal; and
   a d.c. decoupling capacitor connected between said coaxial cable and said power absorption device.

* * * * *